US011158585B1

(12) United States Patent
Fazil

(10) Patent No.: US 11,158,585 B1
(45) Date of Patent: Oct. 26, 2021

(54) WARPAGE COMPENSATING RF SHIELD FRAME

(71) Applicant: Intel IP Corporation, Santa Clar, CA (US)

(72) Inventor: Rizwan Fazil, Portland, OR (US)

(73) Assignee: Intel IP Corporation, Santa Clara, CA (US)

( * ) Notice: Subject to any disclaimer, the term of this patent is extended or adjusted under 35 U.S.C. 154(b) by 699 days.

(21) Appl. No.: 15/937,246

(22) Filed: Mar. 27, 2018

(51) Int. Cl.
H01L 23/552 (2006.01)
H01L 23/00 (2006.01)
H01L 23/10 (2006.01)

(52) U.S. Cl.
CPC .......... *H01L 23/552* (2013.01); *H01L 23/10* (2013.01); *H01L 23/562* (2013.01)

(58) Field of Classification Search
CPC ..... H01L 23/66; H01L 23/585; H01L 23/564; H01L 23/562; H01L 23/552; H01L 23/532
See application file for complete search history.

(56) References Cited

U.S. PATENT DOCUMENTS

| 7,602,065 | B2* | 10/2009 | Hou | H01L 23/562 |
| | | | | 257/758 |
| 8,004,066 | B2* | 8/2011 | Kim | H01L 23/585 |
| | | | | 257/620 |
| 10,546,822 | B2* | 1/2020 | Polomoff | H01L 23/585 |
| 2003/0230798 | A1* | 12/2003 | Lin | H01L 24/11 |
| | | | | 257/704 |
| 2008/0251923 | A1* | 10/2008 | Wang | H01L 23/585 |
| | | | | 257/758 |
| 2009/0140391 | A1* | 6/2009 | Hou | H01L 23/564 |
| | | | | 257/620 |
| 2012/0074560 | A1* | 3/2012 | Goh | H01L 23/562 |
| | | | | 257/704 |
| 2014/0177181 | A1* | 6/2014 | Malek | H05K 3/30 |
| | | | | 361/749 |
| 2015/0348936 | A1* | 12/2015 | Lin | H01L 21/568 |
| | | | | 257/659 |
| 2016/0020177 | A1* | 1/2016 | Tam | H01L 24/97 |
| | | | | 257/659 |
| 2016/0049723 | A1* | 2/2016 | Baks | H01Q 1/2291 |
| | | | | 343/848 |
| 2019/0067210 | A1* | 2/2019 | Polomoff | H01L 23/564 |
| 2019/0098743 | A1* | 3/2019 | Molla | H01L 23/3736 |
| 2020/0194382 | A1* | 6/2020 | Tsai | H01L 23/367 |

FOREIGN PATENT DOCUMENTS

| DE | 102016111325 B4 * | 7/2018 | ........... H01L 21/78 |
| WO | WO-0182669 A1 * | 11/2001 | ........... H05K 9/0032 |
| WO | WO-2019110096 A1 * | 6/2019 | ......... H01L 21/4842 |

* cited by examiner

Primary Examiner — Earl N Taylor
(74) Attorney, Agent, or Firm — Essential Patents Group LLP.

(57) ABSTRACT

An integrated circuit package shield comprising a frame comprising two or more segments, the segments to interlock with one another along a substrate and the segments comprising electrically conductive material to electrically couple to the substrate; and a lid to cover the frame, the lid comprising a conductive material to electrically couple to the substrate.

20 Claims, 10 Drawing Sheets

WARPAGE COMPENSATING RF SHIELD FRAME

BACKGROUND

During manufacturing of integrated circuit (IC) packaging warpage of the package substrate can break solder joints causing open connections between components such as IC dies to the metallization on the package substrate. For radio frequency integrate circuits (RFIC), a grounded shield may be integrated into the package to mitigate electromagnetic interference due to RF generation by the RFIC components on board the package. Suppliers of RF shields specify coplanarities of 100 microns or less. The large non-planarity of the shield combined with substrate warpage, as well as possible warpage of the shield itself, can result in breakage of solder joints connecting the RF shield to the ground metallization of the package. Failure of the shield ground connections reduces the efficacy of the shield to contain RF energy within the package, resulting in significantly lower yields of RFIC packages.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1A:
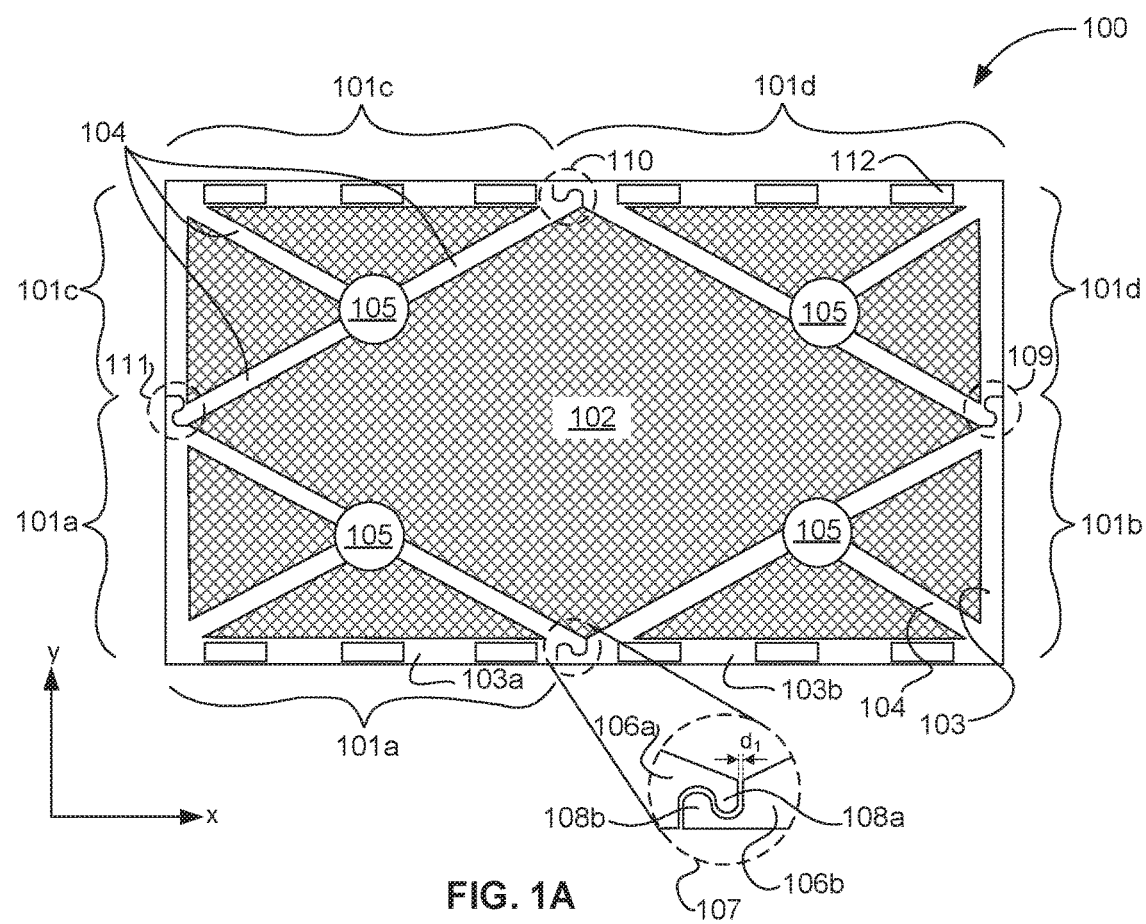
FIG. 1A illustrates a plan view in the x-y plane of an embodiment of a warpage compensating RF shield frame over a package substrate, according to some embodiments of the disclosure.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Radio frequency integrated circuits (RFICs) require careful shielding to prevent electromagnetic interference (EMI) with nearby integrated circuits (ICs) or devices. Presently, packages conceived for RFICs include an RF shield which may be soldered to the ground plane or traces on the package board or substrate. The shield may comprise a frame and lid structure, where the frame is attached by solder to the package substrate board. For the RF shield to be effective, it must remain electrically coupled to the package ground circuit metallization during the life of the IC. However, warpage of the IC package substrate, which generally occurs after solder reflow operations, may result in open solder joints due to coefficient of thermal expansion (CTE) mismatch between the shield and substrate materials. In addition, coplanarity of standard mass-produced RF shields is generally not better than 100 microns. This level of shield co-planarity may exacerbate the occurrence of open solder joints due to substrate warpage.

Package architectures that include RF shields conventionally include a metal lid-like structure that attaches (i.e., by soldering to the ground metallization) to the package substrate and covers all components bonded to the substrate, such as IC dies and discrete components. In some instances, a shield frame is included with the lid forming a shield assembly. The frame may be directly soldered to the substrate, while the lid is fitted over the frame.

As damage to the integrity of the shield/substrate bond, generally in the form of open solder joints, can result from warpage that strains the solder joints, attempts to mitigate such loss of shield integrity have included the use of thicker substrate and/or thicker shield frame to reduce warpage. However, package height restrictions may preclude this approach, as it counters current trends to reduce package dimensions, particularly in the z-dimension. Other approaches, such as a more brute force example of adding more solder paste to strengthen the solder joint, have not presented robust solutions as solder wicking between the lid and frame has been observed.

Large coplanarity, along with substrate warpage can result in open solder joints or shield fall off during reflow. Use of more expensive shield materials also have been considered, where the materials exhibit less warpage or better coplanarity. However, this approach runs counter to requirements to reduce cost of integrated circuits. Another approach has been to divide the frame into two sections in order to compensate substrate warpage by independently attaching the two sections to each half of the substrate, and allowing the separate sections to independently follow the relative bending of each half of the substrate. However, it has been observed that the two frame sections spread during reflow, exceeding frame dimension tolerances. In addition, warpage generally occurs at the corners of the substrate, and not at the edges.

A robust warpage-compensating RF shield frame is disclosed herein that overcomes the afore-mentioned limitations. Embodiments of the disclosed RF shield frame comprises multiple interlocking frame sections. In some embodiments, the disclosed RF shield frame comprises four interlocking sections, attached to the four corners of the substrate. The interlocking frame sections comprise interdigitating interface extensions that restrict lateral motion of the sections during reflow. As substrate warpage generally occurs at the corners of the substrate, attachment of four shield frame sections over the corners allows the frame to follow the warpage at the substrate corners.

The disclosed warpage-compensating RF shield frame provides a mounting structure for a lid to complete the shield. The lid may cover IC dies and discrete components attached to the package substrate. In some embodiments, the lid comprises slots that align with raised embossments on the frame to lock the lid on the frame. The embossments project through the slots, locking the lid to the frame. Movement of the lid relative to the frame is restricted during subsequent package assembly operations, such as encapsulation. In some embodiments, the lid is soldered to the frame.

Assembly of the frame may be carried out by pick and place operations, according to some embodiments. The frame segments are placed either one-by-one, or simultaneously, over the substrate. In some embodiments, each of four frame segments have one or more interlocking sections to assemble into a frame along the edges of a rectangular substrate. The interlocking sections comprise finger-like extensions or protrusions. In some embodiments, interlocking frame segments comprise two interlocking sections that have protrusions that interlock by interdigitation. In some embodiments, each frame segment comprises two interlocking sections. The protrusions of each of the two interlocking sections of a first frame segment interdigitate with those of a second and third mating frame segments. The second and third mating frame segments interlock with fourth frame segment to complete the frame surrounding the rectangular substrate. In some embodiments, the interlocking sections interdigitate along each of the four edges between corners. In this way, the four frame segments may articulate independently about the joints formed by the interlocking sections following the warpage of the substrate, which tends to bend at the corners.

In addition to providing a point of articulation for the independent movement of the individual frame segments, the joints formed by the interlocking sections restrict lateral motion of the frame segments. Without the safeguard of the interlocking sections, lateral motion of the frame segments may occur during solder reflow by surface tension, for example, causing an offset of the frame segments relative to the substrate edges. The dimensional tolerances may be exceeded by unrestricted movement of the frame segments, thereby preventing the lid to be fitted over the substrate. In some embodiments, the seam that separates the interdigitated protrusions has a maximum separation tolerance of 50 microns. In some embodiments, the separation tolerance is 20-30 microns.

In some embodiments, a single protrusion follows a complementary indentation (to allow a mating protrusion to interdigitate). In some embodiments, the protrusions and complementary indentations are rounded. A meandering or S-shaped curve may define the protrusion and indentation pair on an interlocking section of a frame segment. In some embodiments, the protrusions and indentations are pointed. A single protrusion follows a complementary indentation, forming a N-shaped or zig-zag shaped protrusion and indentation pair.

In some embodiments, the protrusion shape is rectilinear. A rectilinear meander may define the protrusion and indentation pair. In some embodiments, the protrusion is an oval or circular tab on one frame segment that fits into a complementary indentation on a mating frame segment.

In some embodiments, frame segments comprise one or more elongate structural members that extend from edge members. When placed on a substrate, the one or more elongate structural members extend over the surface of the substrate. In some embodiments, the one or more elongate structural members extend diagonally from the edge members. In some embodiments, a first diagonal elongate structural member extends from the distal end of a first edge member and terminate at the distal end of the second edge member, forming a triangle in the x-y plane. In some embodiments, a second diagonal elongate structural member extends from the corner to terminate at a point along the first diagonal structural elongate member. In some embodiments, a touch-down pad is affixed to one or more of the elongate structural members. The touch-down pad provides a surface for a pick and place nozzle suction cup to touch down and lift a frame segment.

In some embodiments, the one or more elongate structural members extend orthogonally from the edge members. In some embodiments, two elongate structural members intersect at their distal ends, forming a rectangle with the orthogonal edge members in the x-y plane.

A method of forming a RF shield is also disclosed. The method comprises placing pre-reflow solder over ground circuitry metallization on a package substrate. In some embodiments, solder balls are attached to the ground circuitry metallization. In some embodiments, solder paste is applied over the ground circuitry metallization. The method further comprises the placement of one or more shield frame segments over the package substrate. In some embodiments the one or more shield frame segments are placed over the package substrate by pick and place techniques. The method further comprises placing the frame segments over the substrate in such a way that the that the segments interlock by interdigitation as described above. The method further comprises reflowing the solder to permanently bond the shield frame to the substrate. The bonding is both mechanical and electrical, as the shield frame is coupled to the ground circuitry of the substrate.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

Here, the term "package" generally refers to a self-contained carrier of one or more dies, where the dies are attached to the package substrate, and encapsulated for protection, with integrated or wire-boned interconnects between the die(s) and leads, pins or bumps located on the external portions of the package substrate. The package may contain a single die, or multiple dies, providing a specific function. The package is usually mounted on a printed circuit board for interconnection with other packaged ICs and discrete components, forming a larger circuit.

Here, the term "dielectric" generally refers to any number of non-conductive materials that make up the structure of a package substrate. For purposes of this disclosure, dielectric material may be incorporated into an IC package as layers of laminate film or as a resin molded over IC dies mounted on the substrate.

Here, the term "metallization" generally refers to metal layers formed over the dielectric material of the package substrate. The metal layers are generally patterned to form metal structures such as traces and bond pads. The metallization of a package substrate may be confined to a single layer or in multiple layers separated by layers of dielectric.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

Relative distances at times may be indicated by the terms "proximal" and "distal" when referring to elongate structures in particular. "Distal" may refer to a point at or near the end of an elongated structure that is extended furthest from other structures near the "proximal" end of the elongate structure. "Proximal" may refer to the origin of the structure, for example, wherefrom the elongate structure extends (e.g., "edge members extending from a corner", where the corner is the origin).

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

FIG. 1A illustrates a plan view in the x-y plane of RF shield frame 100 over a package substrate, according to some embodiments of the disclosure.

In FIG. 1A, RF shield frame 100 comprises frame segments 101 that interlock together. FIG. 1A depicts four interlocking frame segments 101a, 101b, 101c and 101d, distributed about the four edges of package substrate 102. In some embodiments, interlocking frame segments 101a-d are mechanically and electrically coupled to substrate 102. In some embodiments, interlocking frame segments 101a-d are solder-bonded to the ground metallization of substrate 102 (including a ground plane, not shown). In the illustrated embodiment, each of the frame segments 101a-d comprise orthogonal edge members 103 and elongate structural members 104, extending diagonally over portions of substrate 102. In the illustrated embodiment, frame segments 101a-d comprise three diagonal elongate structural members 104 that extend from edge members 103. The three elongate members 104 terminate at a common point. In some embodiments, pads 105 are disposed along elongate structural members 104. Pads 105 may be employed to provide a surface for pick-and-place nozzle suction cup touch-down.

In some embodiments, frame segments 101a-101d comprise conductive materials such as copper, nickel and beryllium. In some embodiments, frame segments comprise sheet metal comprising the copper, nickel and beryllium having thickness ranging from 100 to 500 microns.

Frame segments 101a and 101b comprise two interlocking sections 106a and 106b, respectively, disposed at the distal ends of edge members 103a and 103b, respectively. For the embodiment depicted in FIG. 1A, a magnified view of adjacent interlocking sections 106a and 106b is shown within the zoom window (interlocking interface 107 encircled within dashed circle). The adjacent interlocking sections 106a and 106b comprise interdigitating protrusions 108a and 108b, respectively. In some embodiments, interlocking sections (e.g., 106a and 106b) comprise multiple interdigitating protrusions (e.g., 108a and 108b). The interdigitating protrusions 108a and 108b restrict lateral movement in both the x and y directions of frame segments 101a and 101b. For example, lateral motion of frame segments 101a and 101b may occur during solder reflow, allowing the frame segments to move apart beyond the lateral tolerance of the package.

In the illustrated embodiment, interdigitating protrusions 108a and 108b are rounded, having an S-shaped boundary. A gap may exist within the boundary, where the gap separation is the distance $d_1$ denoted in FIG. 1A. In some embodiments, the distance $d_1$ is 50 microns. In some embodiments, distance $d_1$ is less than 50 microns. While the interlocking interfaces of frame segments 103a and 103b were described in detail above, each frame segment comprises two interlocking sections at the distal ends of the corresponding edge members, similar to 106a and 106b.

The boundary between the interdigitated protrusions may provide an articulating joint between adjacent frame segments (e.g., 101a and 101b), allowing a degree of freedom of motion in the z-direction of frame segments 101a-d to follow out-of-plane warpage of substrate 102. The four frame segments 101a-d may articulate independently at the joints formed within each of the four interlocking interfaces 107, 109, 110 and 111, allowing flexible warpage adjustment of RF shield frame 100. The need to match CTE or utilize thick RF shield frames and/or package substrates to mitigate damage to the bond integrity of the RF shield due to substrate warpage may be obviated by the employment of a flexible RF frame comprising articulating joints.

The interdigitated portion (comprising protrusions 108a and 108b) shown in the magnified view of interlocking interface 107 may be repeated for each interlocking interface 109, 110 and 111. Frame segments 101a interfaces with both frame segment 101b and 101c. The corresponding interlocking interfaces 107 and 111, respectively, are denoted by dashed circles. Similarly, frame segment 101b interfaces with frame segment 101d (interlocking interface 109), and frame segment 101d interfaces with frame segment 101c (interlocking interface 110). The four interlocking interfaces 107, 109, 110 and 111 couple together the four frame segments 101a-d of RF shield frame 100 in a manner substantially the same as described in detail for interlocking interface 107. In some embodiments, embossments 112 are provided to aid in shield lid attachment (not shown) to RF shield frame 100, as described below.

Figure 1B:
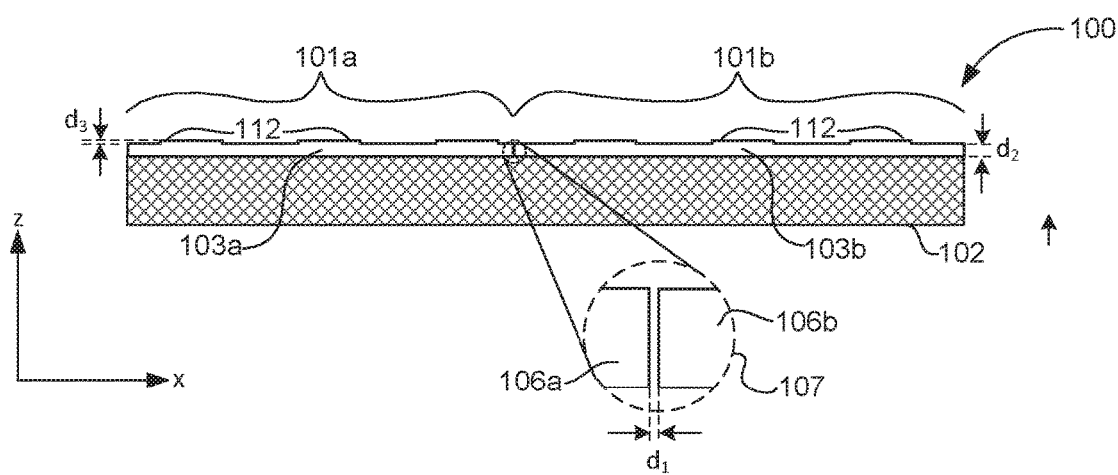
FIG. 1B illustrates a profile view in the x-z plane of the embodiment of a warpage compensating RF shield frame over a package substrate shown in FIG. 1A, according to some embodiments of the disclosure.

FIG. 1B illustrates a profile view in the x-z plane of RF shield frame 100 over a package substrate, according to some embodiments of the disclosure.

FIG. 1B shows details in the x-z plane of frame members 103a and 103b of frame segments 101a and 101b, respectively. These details may be repeated for frame members 101c and 101d, not shown in FIG. 1B. Frame members 103a and 103b extend a distance $d_2$ in the x-z plane, corresponding substantially to the thickness of frame members 103a and 103b. Embossments 112 are shown in profile on the top portions of frame members 103a and 103b, extending a distance $d_3$ above the edge members 103a and 103b. In some embodiments, embossments 112 are provided to align with slots on a mating lid (described below and shown in FIG. 5A).

A profile view of interlocking interface 107 is shown in the circled region, encompassing interlocking sections 106a and 106b. The gap between interlocking sections 106a and 106b is shown and denoted by distance $d_1$.

Figure 2A:
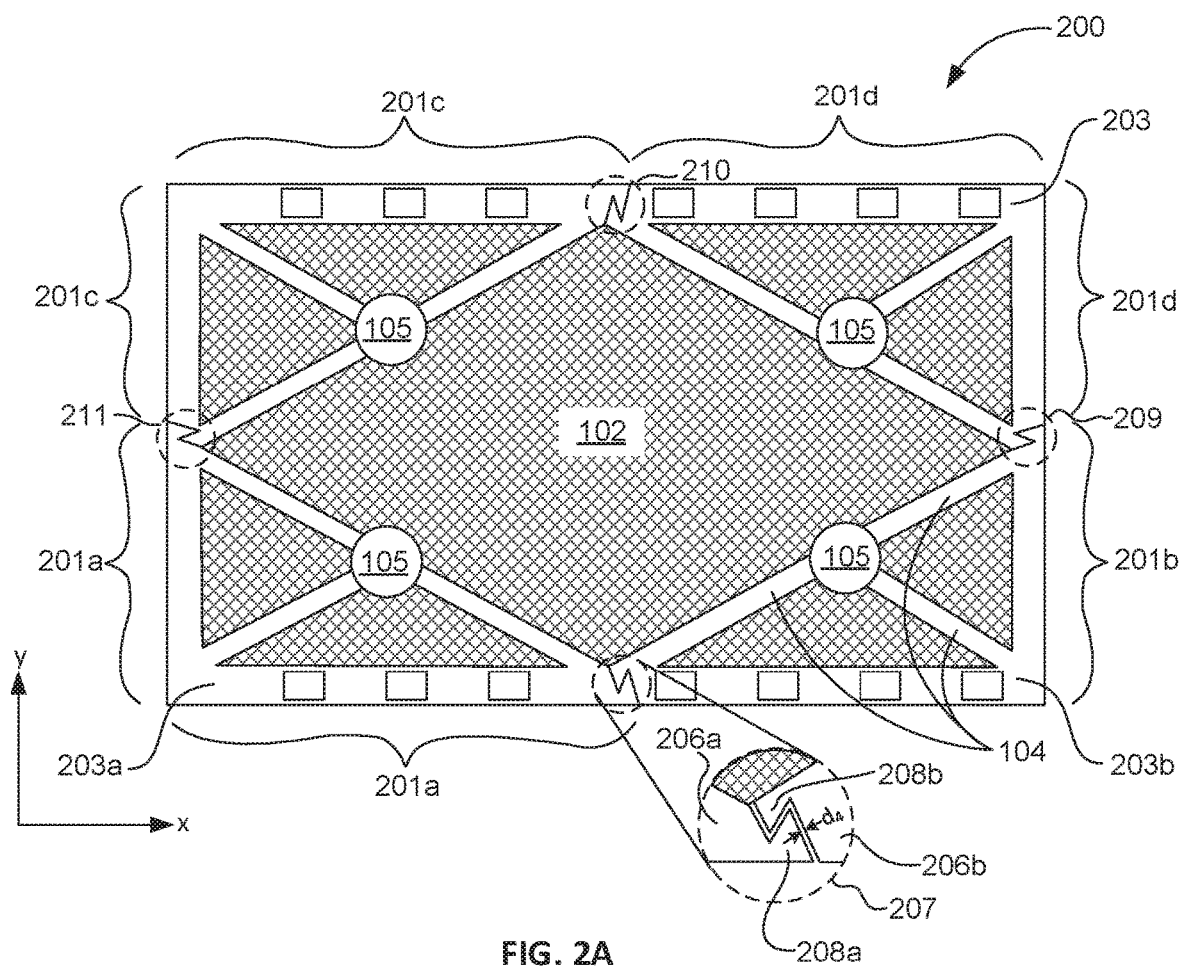
FIG. 2A illustrates a plan view in the x-y plane of an embodiment of a warpage compensating RF shield frame over a package substrate, according to some embodiments of the disclosure.

FIG. 2A illustrates a plan view in the x-y plane of RF shield frame 200 over a package substrate, according to some embodiments of the disclosure.

In FIG. 2A, RF shield frame 200 comprises frame segments 201a, 201b, 201c and 201d disposed over substrate 102. In the illustrated embodiment, frame segments 201a-d are substantially similar. The following description references the details of one or both of adjacent frame segments 201a and 201b, which may be applied to frame segments 201c and 201d. All four frame segments 201a-d comprises orthogonal edge members (e.g., 203a and 204a), which extend from a corner along orthogonal edges of substrate 102. Elongate structural members 104 extend from edge members (e.g., 203a and 204a) of frame segments 201a-d over substrate 102. In some embodiments, elongate structural members 104 extend diagonally from edge members 203 and 204, imparting a right triangular shape to frame segments 201a-d. Corners of frame segments 201a-d may coincide with corners of substrate 102.

In some embodiments, frame segments 201a-201d comprise conductive materials such as copper, nickel and beryllium. In some embodiments, frame segments comprise sheet metal comprising the copper, nickel and beryllium having thickness ranging from 100 to 500 microns.

Adjacent frame segments 201a and 201b comprise interlocking sections 206a and 206b, located at the distal ends of edge members 203a and 203b, respectively. Interlocking sections 206a and 206b comprise protrusions 208a and 208b, respectively, which are interdigitated, forming an articulating hinge-like structure in an interlocking interface 207. A magnified view is shown of interlocking interface 207 (encircled within dashed circle). Interlocking interface 207 is shared between frame segments 201a and 201b, where interlocking sections 206a and 206b are respectively parts of mating frame segments 201a and 201b.

In the illustrated embodiment of FIG. 2A, protrusions 208a and 208b have a pointed shape. A zig-zag shaped boundary is between interdigitated protrusions 208a and 208b. The structural features of interlocking interface 207 are substantially repeated by interlocking interfaces 209, 210 and 211, where each interlocking interface couples adjacent frame segments 201a-b. Interlocking interfaces 209, 210 and 211 are encompassed by the dashed circles on each edge of RF shield frame 200. The zig-zag boundary between interdigitated protrusions 208a and 208b comprises a gap separated by a distance $d_4$. Interdigitated protrusions 208a and 208b restrict lateral movement of linked frame segments 201a and 201b. In some embodiments, distance $d_4$ is 50 microns or less.

In some embodiments, the gap between interdigitated protrusions 208a and 208b functions as an articulating joint, allowing linked frame segments 201a and 201b to bend in the z-direction, following warpage of substrate 102.

While the above description has been confined to interlocking interface 207, it is understood that in some embodiments, interlocking interfaces 209, 210 and 211 comprise interdigitating protrusions that are substantially the same as or similar to interdigitating protrusions 208a and 208b, having a pointed shape, and separated by zig-zag boundaries. Interlocking interfaces 209, 210 and 211 comprise gaps similar to the gap shown in the magnified view of interlocking section 207, having a separation distance substantially similar to $d_4$. In a substantially similar manner, interlocking sections 209, 210 and 211 respectively link together frame segments 201b and 201c; 201c and 201d; and 201d and 201a. In some embodiments, at least one of interlocking interfaces 209, 210 and 211 comprises interdigitating protrusions having a shape that is substantially different than interdigitating protrusions 208a and 208b.

Figure 2B:
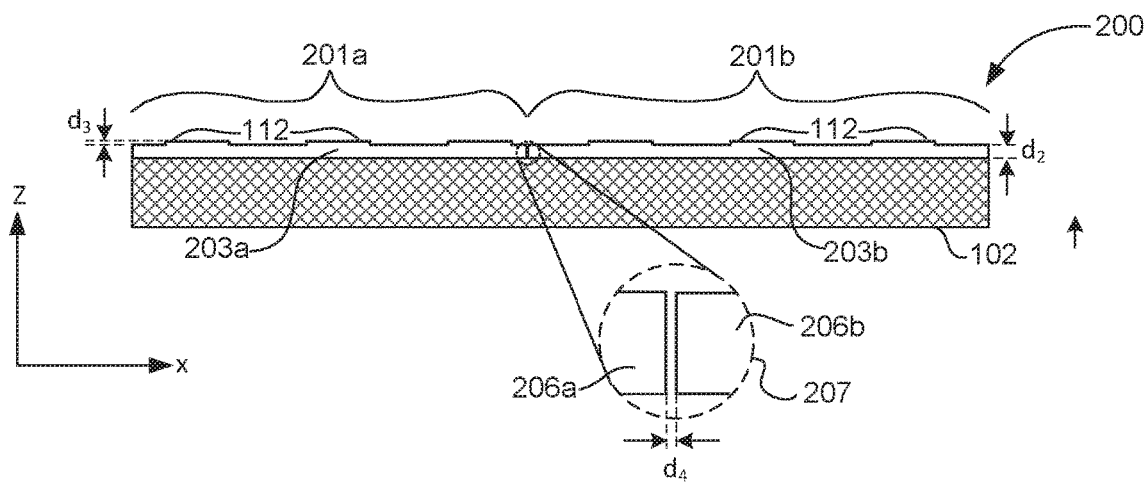
FIG. 2B illustrates a profile view in the x-z plane of the embodiment of a warpage compensating RF shield frame over a package substrate shown in FIG. 2A, according to some embodiments of the disclosure.

FIG. 2B illustrates a profile view in the x-z plane of RF shield frame 200, according to some embodiments of the disclosure.

FIG. 2B shows details in the x-z plane of frame members 203a and 203b of frame segments 201a and 201b, respectively. In some embodiments, the details depicted in the view of FIG. 2B may be repeated for frame members 201c and 201d, not shown in FIG. 2B. In the illustrated embodiment, the edges of substrate 102 are partially clad by portions of frame members 203a and 203b, which are folded into the x-z plane, and extend over the edges of substrate 102 a distance $d_2$ from the top of substrate 102. Embossments 112 are shown in profile view on the top portions of edge members 203a and 203b of frame segments 201a and 201b, respectively, extending a distance $d_3$ above edge members 203a and 203b. In some embodiments, embossments 112 are provided to align with slots on a mating lid (described below and shown in FIG. 5A). In some embodiments, embossments 112 are omitted.

Figure 3A:
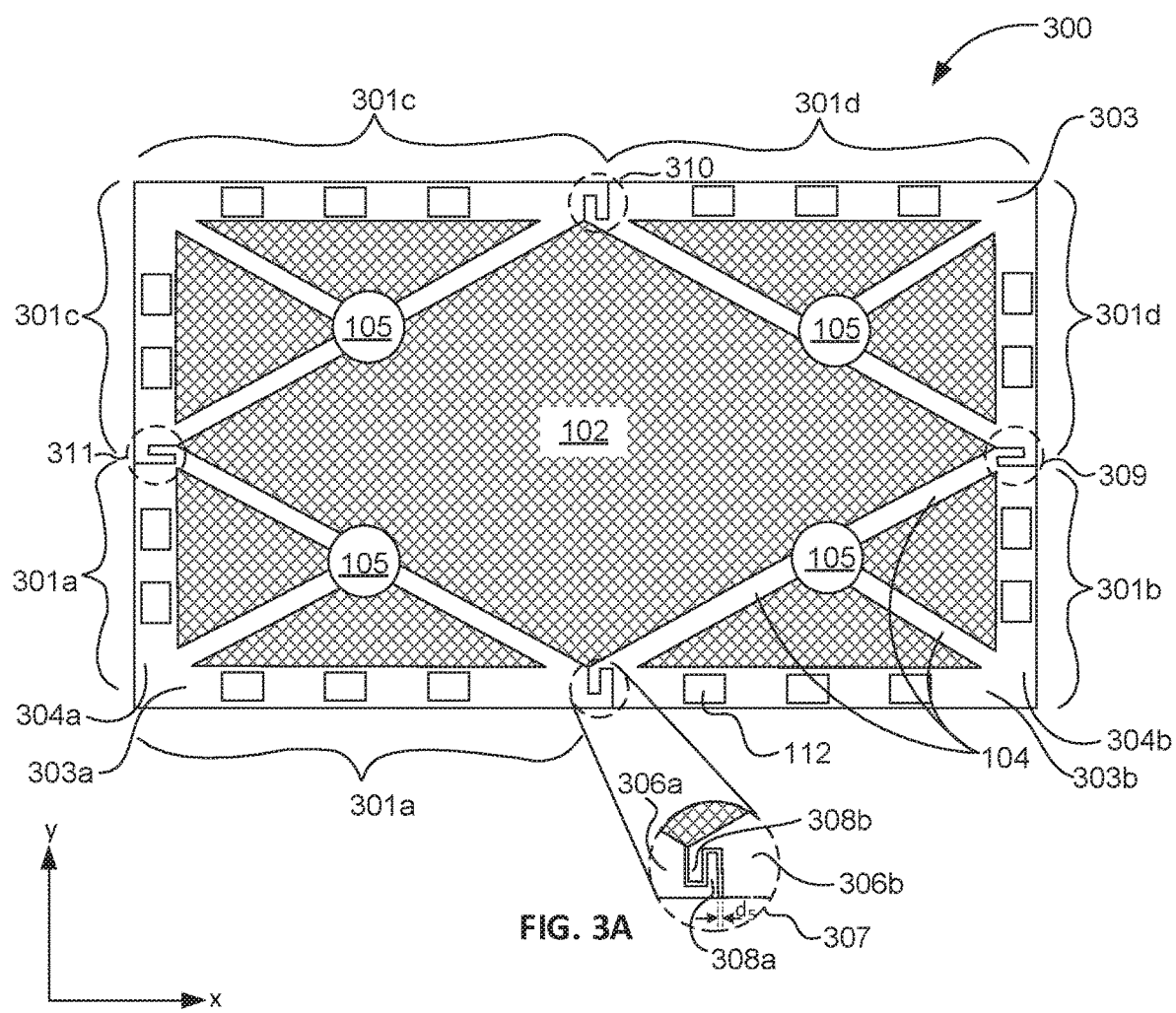
FIG. 3A illustrates a plan view in the x-y plane of an embodiment of a warpage compensating RF shield frame over a package substrate, according to some embodiments of the disclosure.

FIG. 3A illustrates a plan view in the x-y plane of RF shield frame 300, according to some embodiments of the disclosure.

In FIG. 3A, RF shield frame 300 comprises frame segments 301a, 301b, 301c and 301d. In some embodiments, frame segments 301a-d are substantially structurally similar. In some embodiments, RF shield frame 300 has substantial symmetry. For clarity, therefor, structural details described for structural members of frame segments 301a and 301b are generally repeatable for 301c and 301d. Frame segments 301a and 301b comprise orthogonal edge members 303a and 303b, where edge member 303a extends orthogonally from edge member 303b, according to some embodiments. In the illustrated embodiment, frame segments 301a and 301b comprise elongate structural members 104 that extend diagonally over substrate 102 from edge members 303b and 304b. In some embodiments, elongate structural members 104 terminate at a common point. In some embodiments, pads 105 are disposed along elongate structural members 104. As noted above (e.g., see discussion related to FIGS. 1A and 2A), pads 105 may be employed to provide a surface for pick-and-place nozzle suction cup touch-down.

Frame segments 301a and 301b comprise interlocking sections 306a and 306b at the distal end of edge members 303a and 303b, respectively, where interlocking sections 306a and 306b are interfaced. A magnified view is shown of interlocking interface 307 (within dashed circle). In the illustrated embodiment of FIG. 3A, protrusions 308a and 308b have a rectangular shape. A rectilinear meandering boundary is between interdigitated protrusions 308a and 308b. Interlocking interfaces 309, 310 and 311 are encompassed by the dashed circles on each edge of RF shield frame 300. The structural features of interlocking interface 307 are substantially repeated by interlocking interfaces 309, 310 and 311, coupling frame segments 301b and 301d, 301d with 301c, and 301c with 301a, respectively.

In some embodiments, frame segments 301a-301d comprise conductive materials such as copper, nickel and beryllium. In some embodiments, frame segments comprise sheet metal comprising the copper, nickel and beryllium having thickness ranging from 100 to 500 microns.

The rectilinear meandering boundary between interdigitated protrusions 308a and 308b comprises a gap separated by a distance $d_5$. Interdigitated protrusions 308a and 308b restrict lateral movement of linked frame segments 301a and 301b. In some embodiments, distance $d_5$ ranges between 0 and 50 microns. In some embodiments, interdigitated protrusions 308a and 308b together function as an articulating hinge, allowing linked frame segments 301a and 301b to bend in the z-direction, following warpage of substrate 102.

In some embodiments, frame members 301a and 301b comprise embossments 112 distributed along at least one of edge members (e.g., 303a and 303b). In some embodiments, embossments 112 are not present. Embossments 112 are described in more detail below (FIG. 3B).

Interlocking interfaces 309, 310 and 311 comprise interdigitating protrusions that are substantially the same as interdigitating protrusions 308a and 308b, separated by rectilinear meandering boundaries. Interlocking sections 309, 310 and 311 respectively link together frame segments 301b and 301d; 301d and 301c; and 301c and 301a. In some embodiments, at least one of interlocking interfaces 309, 310 and 311 comprises interdigitating protrusions having a shape that is substantially different than interdigitating protrusions 308a and 308b.

Figure 3B:
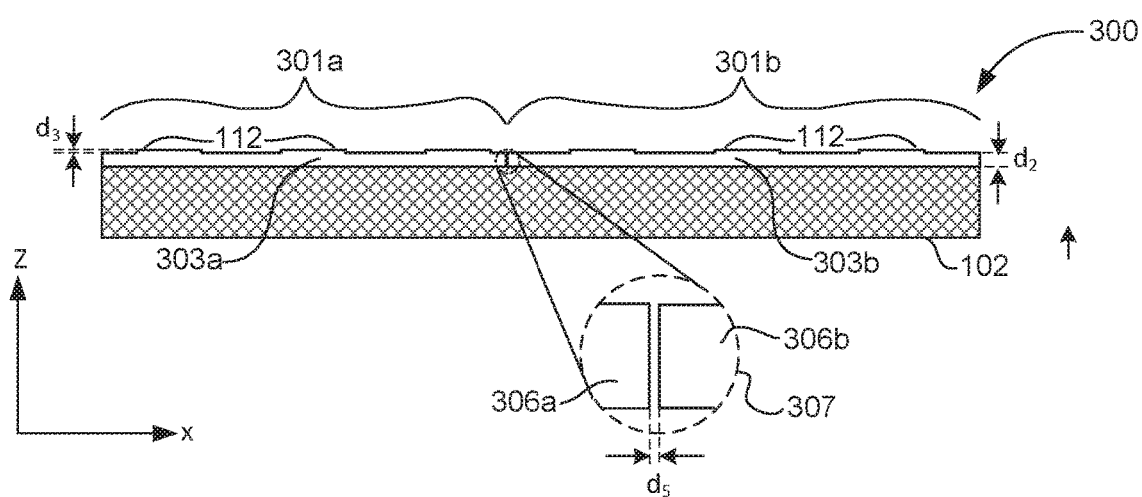
FIG. 3B illustrates a profile view in the x-z plane of the embodiment of a warpage compensating RF shield frame over a package substrate shown in FIG. 3A, according to some embodiments of the disclosure.

FIG. 3B illustrates a profile view in the x-z plane of RF shield frame 300, according to some embodiments of the disclosure.

In the illustrated embodiments shown in the profile view of FIG. 3B, portions of edge members 303a and 303b are folded into the x-z plane over an edge of substrate 102. In some embodiments, the details shown in the view of FIG. 3B for frame members 301a and 301b are repeated for frame members 301c and 301d, having edge members along the remaining three edges of substrate 102, not shown. In some embodiments, edge members 303a and 303b extend in the x-z plane approximately distance $d_2$ from the top of substrate 102, corresponding to the thickness of frame members 301a and 301b.

Embossments 112 are shown in profile view extending a distance $d_3$ above the top portions of edge members 303a and 303b and 304a and 304b. In some embodiments, embossments 112 are to align with slots on a mating RF shield lid (described below and shown in FIG. 5A). In some embodiments, embossments 112 are omitted.

Figure 4A:
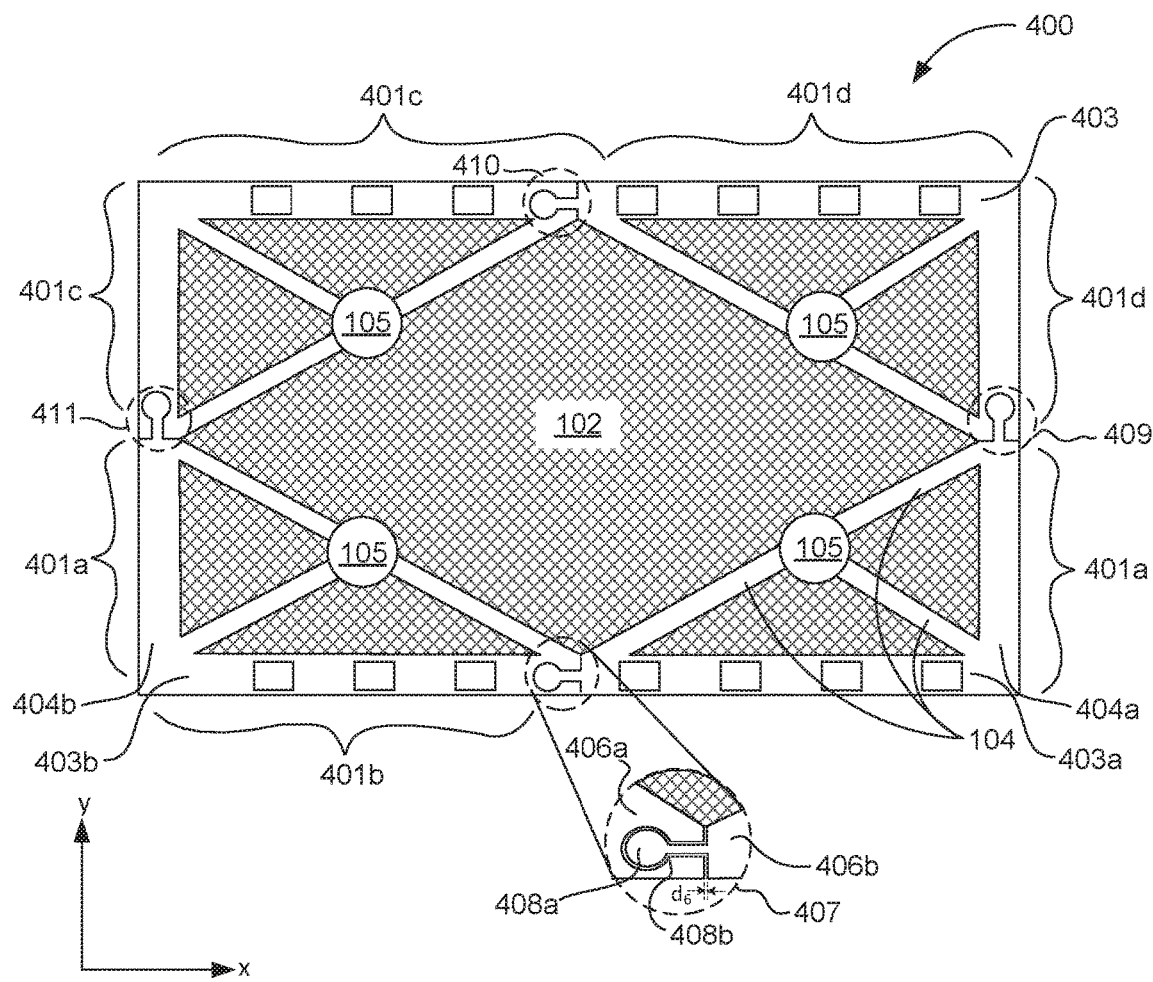
FIG. 4A illustrates a plan view in the x-y plane of an embodiment of a warpage compensating RF shield frame over a package substrate, according to embodiments of the disclosure.

FIG. 4A illustrates a plan view in the x-y plane of warpage-compensating RF shield frame 400, according to embodiments of the disclosure.

In FIG. 4A, RF shield frame 400 comprises frame segments 401a, 401b, 401c and 401d along corners of substrate 102. In some embodiments, frame segments 401a-d are substantially similar. For the purposes of clarity, the following description references the details of one or both of adjacent frame segments 401a and 401b, which then may be applied to frame segment 401c and 401d. Frame segments 401a-d comprise orthogonal edge members (e.g., 403a and 404a, 403b and 404b) disposed along one edge of substrate 102. In some embodiments, elongate structural members 104 extend from edge members (e.g., 403a and 404a) over substrate 102. In some embodiments, elongate structural members 104 extend diagonally from edge members (e.g., 403a and 404b), imparting a right triangular shape to frame segments 401a-d. Corners of frame segments 401a-d may coincide with corners of substrate 102.

Adjacent frame segments 401a and 401b comprise interlocking sections 406a and 406b, located at the distal ends of edge members 403a and 403b, respectively. Interlocking sections 406a and 406b comprise protrusions 408a and 408b, respectively, which are interdigitated in the illustrated embodiment, forming an articulating hinge. A magnified view is shown of interlocking interface 407 (encircled within dashed circle).

In the embodiment illustrated in FIG. 4A, interlocking interface 407 comprises interdigitating structures 408a and 408b in a lock and key configuration. In some embodiments, interdigitating structure 408a is a spoon-shaped tab extending from interlocking section 406a. Interdigitating structure 408a inserts into mating or docking interdigitating structure 408b, disposed within interlocking section 406b.

Interdigitating structures 408a and 408b restrict lateral movement of frame segments 401a and 401b. In some embodiments, interlocking interface comprises a gap separating interdigitating structures 408a and 408b by a distance $d_6$. In some embodiments, distance $d_6$ ranges between 0 and 50 microns.

The structural features of interlocking interface 407 may be substantially repeated by interlocking interfaces 409, 410 and 411, respectively coupling frame segments 401a with 401d, 401d with 401c, and 401c with 401a. Interlocking interfaces 409, 410 and 411 are encompassed by the dashed circles on each edge of RF shield frame 400.

In some embodiments, frame segments 401a-401d comprise conductive materials such as copper, nickel and beryllium. In some embodiments, frame segments comprise sheet metal comprising the copper, nickel and beryllium having thickness ranging from 100 to 500 microns.

Figure 4B:
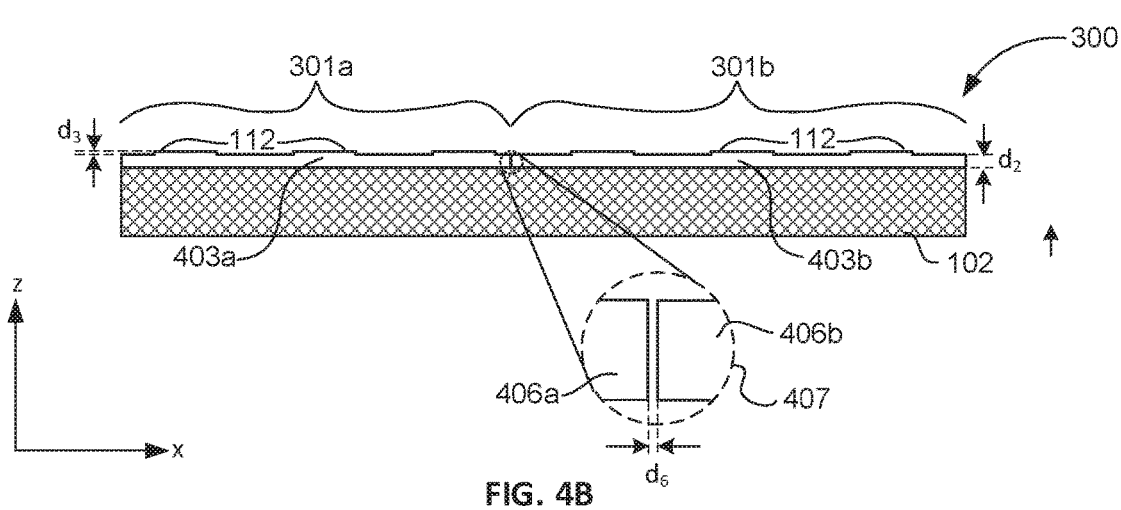
FIG. 4B illustrates a profile view in the x-z plane of the embodiment of a warpage compensating RF shield frame over a package substrate shown in FIG. 4A, according to some embodiments of the disclosure.

FIG. 4B illustrates a profile view in the x-z plane of warpage-compensating RF shield frame 400, according to some embodiments of the disclosure.

FIG. 4B shows details in the x-z plane of frame members 403a and 403b of frame segments 401a and 401b, respectively. In some embodiments, the details depicted in the view of FIG. 4B may be repeated for frame members 401c and 401d, not shown in FIG. 4B. In the illustrated embodiment, the edges of substrate 102 are at least partially clad by portions of edge members 403a and 403b, which are folded into the x-z plane. Edge members 403a and 403b extend down from the top of substrate 102 by a distance $d_2$, corresponding to the thickness of frame members 401a and 401b, according to some embodiments. Embossments 112 are shown in profile view extending over edge members 403a and 403b by a distance $d_3$. In some embodiments, embossments 112 are provided to align with slots on a mating lid (not shown; described below and shown in FIG. 5A). In some embodiments, embossments 112 are omitted.

Figure 5A:
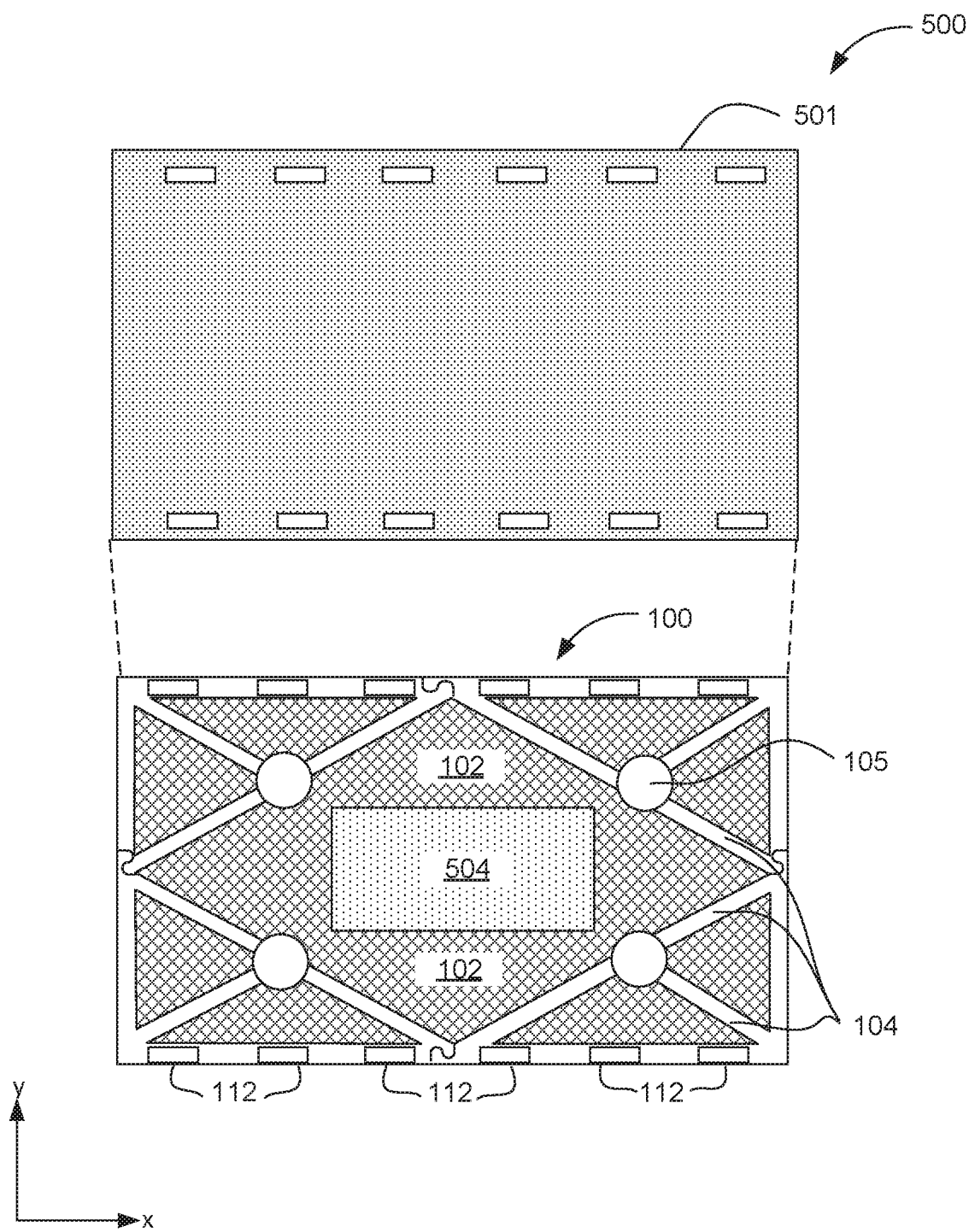
FIG. 5A illustrates a plan view in the x-y plane of a warpage compensating RF shield assembly comprising an RF shield lid and an RF shield frame, according to some embodiments of the disclosure.

FIG. 5A illustrates a plan view in the x-y plane of a warpage-compensating RF shield assembly 500 comprising RF shield lid 501 and RF shield frame 100, according to some embodiments of the disclosure.

In FIG. 5A, warpage-compensating RF shield assembly 500 is shown as separate parts comprising RF shield lid 501 and RF shield frame 100, related by the dashed lines. RF shield frame 100 is shown fully assembled and mounted on package substrate 102. RF shield frame 100 comprises elongate members 104 and pads 105 to facilitate assembly, as described above. In the illustrated embodiment, RF shield lid 501 comprises slots 502 that align with embossments 112 on RF shield frame 100. In some embodiments, slots 502 and embossments 112 are omitted. In some embodiments, RF shield lid 501 is to be press-fitted onto RF shield frame 100. Details of the interaction between embossments 112 and slots 502 are given below for FIG. 5C. In some embodiments, RF shield lid 500 comprise conductive materials such as copper, nickel and beryllium. In some embodiments, RF shield lid comprises sheet metal comprising the copper, nickel and beryllium having thickness ranging from 100 to 500 microns.

Referring again to FIG. 5A, substrate 102 comprises IC die 504 attached substantially at the center of substrate 102. In some embodiments, multiple dies are attached to substrate 102. Elongate members 104 may be arranged in different configurations to accommodate various die layouts. In order to accommodate RF shield lid 501, IC die 504 may have a thickness no greater than the thickness of the structural elements of RF shield frame 100.

Figure 5B:
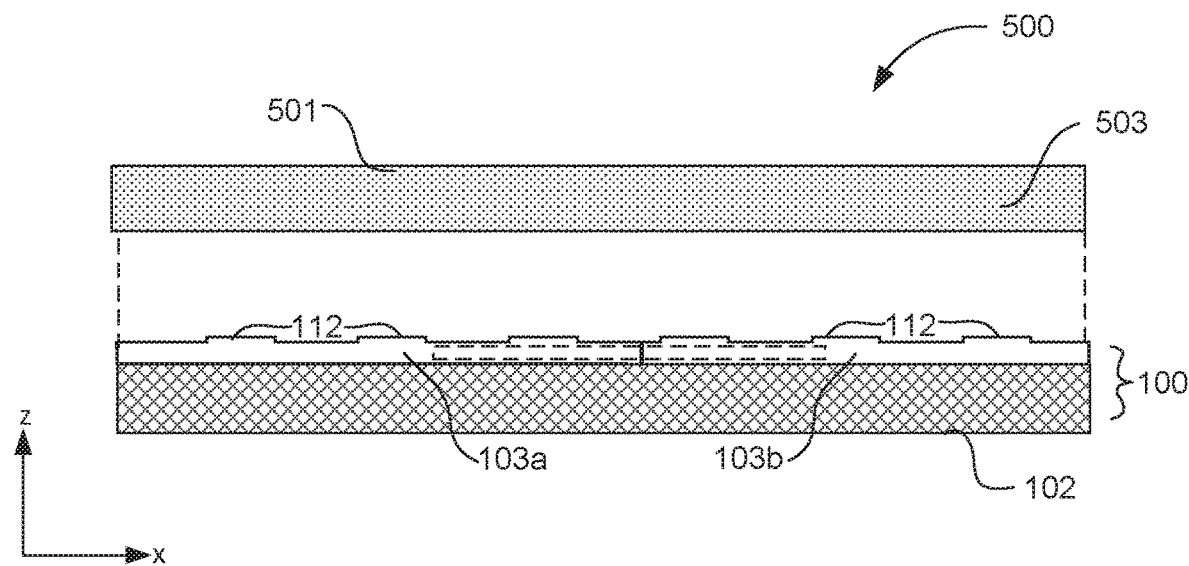
FIG. 5B illustrates a profile view in the x-z plane of separated components of a warpage compensating RF shield assembly 500 comprising RF shield lid and RF shield frame, according to some embodiments of the disclosure.

FIG. 5B illustrates an exploded view of separate components of comprising RF shield lid 501 and RF shield frame 100 of RF shield assembly 500 in the x-z plane, according to some embodiments of the disclosure.

In FIG. 5B, lateral edges of RF shield lid 501 are aligned with lateral edges of RF shield frame 100, as indicated by the dashed connector lines. RF shield frame 100 is shown mounted on substrate 102. In some embodiments, edge 503 of RF shield lid 501 is to slide over edge members 103a and 103b of RF shield frame 100. A profile outline of an IC die (e.g., IC die 504 in FIG. 5A) is shown as a hidden dashed rectangle centered over substrate 102 just below the top of frame members 103a and 103b. In the illustrated embodiment, the IC die profile does not exceed the clearance of the sheet metal thickness of frame members 103a and 103b (e.g., distance $d_3$ in FIG. 3B).

Figure 5C:
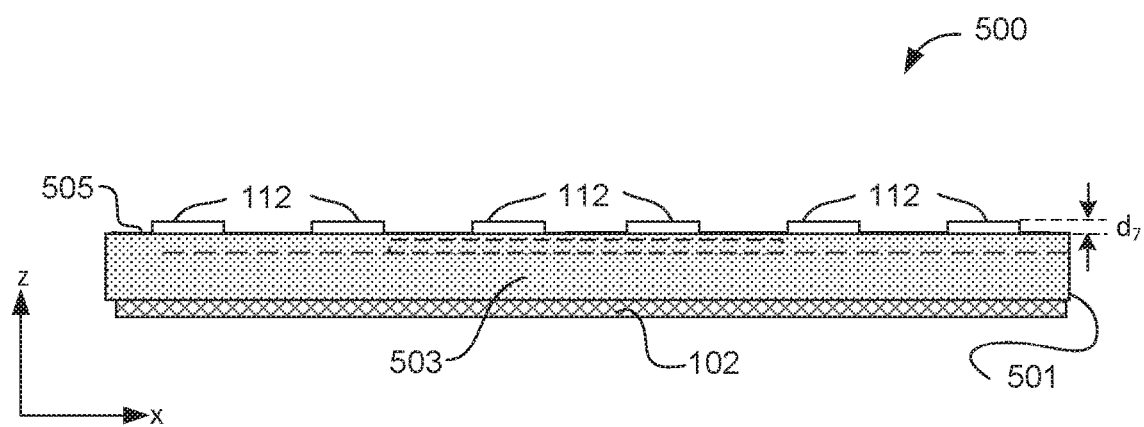
FIG. 5C illustrates a profile view in the x-z plane of a warpage compensating RF shield assembly in the assembled state, according to some embodiments of the disclosure.

FIG. 5C illustrates a profile view in the x-z plane of RF shield assembly 500 in the assembled state, according to some embodiments of the disclosure. Embossments 112 extend a distance $d_7$ above the top of RF shield frame 100 (shown in hidden dashed line below the top of RF shield lid 501). In some embodiments, $d_7$ may be several hundred microns, including the thickness of the sheet metal of RF shield frame 100. In some embodiments, distance $d_7$ ranges between 100 and 500 microns, and includes clearance for an attached IC die, (e.g., IC die 504 in FIG. 5A), indicated by the dashed hidden rectangle centered on the top surface of substrate 102 (indicated by the dashed hidden line below lid top 505). In some embodiments, RF shield lid 501 is attached by a press-fit process onto RF shield frame 100. In some embodiments, embossments 112 are omitted. RF shield lid 503 may rest on RF shield frame 100 with some lateral tolerance.

Soldering or welding lid 501 to frame 100 may restrict or prevent frame segments from following out-of-plane warpage of corners or other portions of substrate 102. Embossments 112 provide RF shield lid 501 with a plurality of intimate contact points with RF shield frame 100 by virtue of the ability of embossments 112 to slide vertically within slots 502. When substrate 102 undergoes warpage, the corners typically warp out of the x-y plane, causing individual frame segments of RF shield frame 100 to follow this warpage substrate 102 by articulating about the interdigitated joints without unduly straining any solder joints between RF shield frame 100 and substrate 102, creating open solder joints.

RF shield 500 is generally grounded through substrate 102. Open solder joints between RF shield lid 501 and RF shield frame 100 may significantly reduce the effectiveness of RF shield assembly 500 against EMI and RFI emanating from the integrated circuit generating the RF. In some embodiments, embossments 112 extend in the z-direction through slots 502 by several hundred microns, allowing RF shield assembly 500 to tolerate significant warpage of substrate 102.

Figure 6:
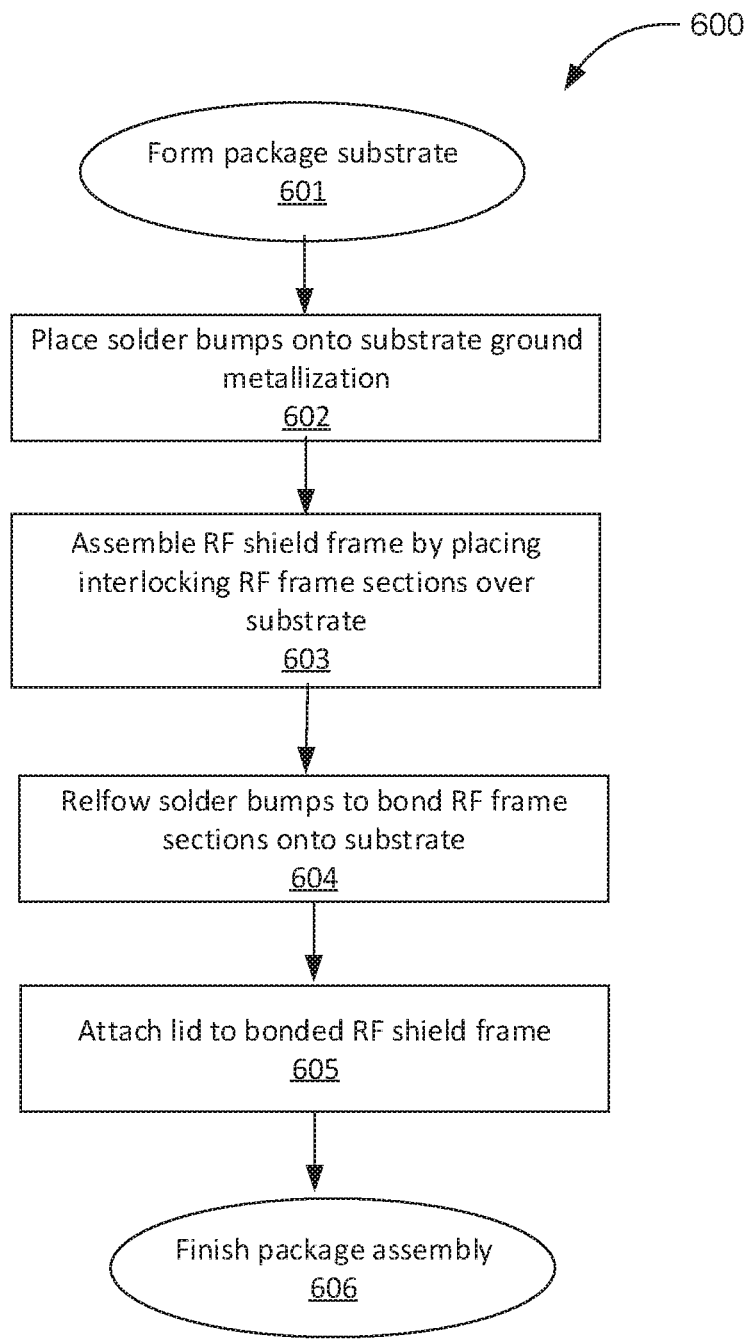
FIG. 6 illustrates a flow chart summarizing an exemplary method for forming a warpage compensating RF shield frame, according to embodiments of the disclosure.

FIG. 6 illustrates flow chart 600, summarizing an exemplary method for forming a RF shield frame according to some embodiments of the disclosure.

At operation 601, a package substrate (e.g., substrate 102) is received for attachment of the RF shield according to the some of the embodiments of the disclosure. The state of assembly of the package may include attachment of IC dies onto the substrate. In some embodiments other components, such as a stiffener, are attached.

At operation 602, pre-reflow solder points are applied to the substrate. The substrate may be bumped with solder balls, or points of solder paste may be applied along the edges and at points on the interior region of the substrate. Solder points may be applied over ground metallization on the substrate, such as a ground plane and/or ground traces.

At operation 603, the RF shield frame is assembled onto the substrate. The RF shield frame is assembled by placement of frame segments. In exemplary embodiments, four frame segments are placed at each corner of the substrate either one-by-one, or all four simultaneously. The frame segments are assembled so that articulating joints are made by linking interlocking sections by interdigitation. Pick-and-place operations may be employed to manipulate the frame segments and assemble them on the substrate. In some embodiments, frame segments are assembled one at a time. In some embodiments, frame segments are placed and assembled simultaneously.

At operation 604, the substrate is subjected to solder reflow temperatures in order to melt the solder points, and reflowing the solder to form bonds between the RF shield frame segments to the substrate. During reflow, interlocking joints (e.g., the joint formed by interdigitating protrusions 108a and 108b in FIG. 1A) restrict lateral movement of the individual frame segments, which may float on the liquid solder. Interlocking joints between frame segment restrict lateral separation of the individual frame segments, which may move laterally and may fall off of the substrate. Minor lateral motion of the frame segments may cause edge members to overhang the substrate, exceeding package dimensional tolerances in the x and/or y dimensions.

At operation 605, a RF shield lid (e.g., RF shield lid 504 in FIGS. 5A-5C) is attached to the bonded RF shield frame. In some embodiments, the RF shield frame comprises embossments (e.g., 112 in FIG. 1A) that are aligned with slots or apertures in the RF shield lid. In some embodiments, the RF shield lid is press-fit onto the RF shield frame. The attachment of the lid completes the assembly RF shield (e.g., 500 in FIG. 5C) on the package substrate.

At operation 606, the package substrate comprising the RF shield is passed on to downstream package assembly operations (e.g., package component attachment, encapsulation).

FIGS. 7A-7G illustrate a progression of operations expanding upon the exemplary method shown in FIG. 6 for making warpage compensating RF shield frame 100, according to some embodiments of the disclosure.

Figure 7A:
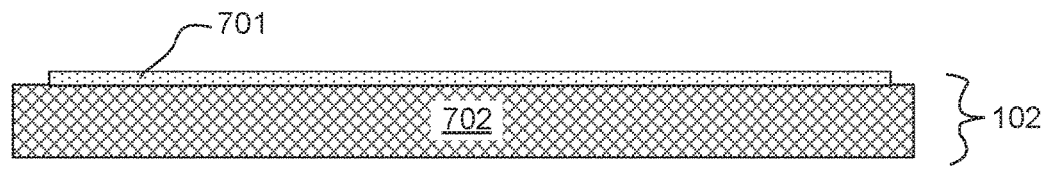
FIGS. 7A-7G illustrate a progression of operations comprised by exemplary method for making a warpage compensating RF shield frame, according to some embodiments of the disclosure.

In the operation depicted in FIG. 7A, package substrate 102 is received partially assembled. For clarity, only metallization layer 701 over dielectric 602 is shown to represent package substrate 102 as received for assembly of a warpage-compensating RF shield frame, according to some embodiments. In some embodiments, package substrate 102 as received comprises mounted components such as IC dies, discrete components, stiffeners, etc. Metallization layer 701 may be part of the ground circuitry. In some embodiments, metallization layer 701 comprises a ground plane and traces coupled to the ground plane. In some embodiments, metallization layer 701 comprises traces electrically coupled to metal structures to be electrically coupled to ground circuitry.

Figure 7B:
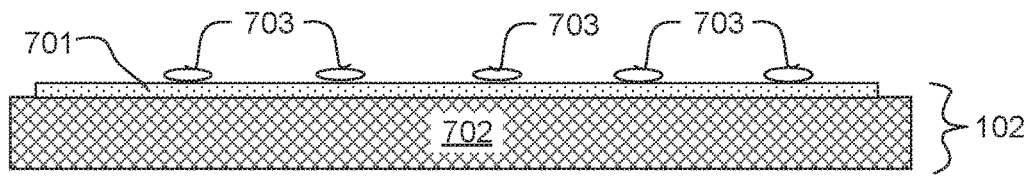

In the operation depicted in FIG. 7B, solder points 703 are dispensed over portions of metallization layer 701. In some embodiments, solder points 703 are boules of semi-solid solder paste. In some embodiments, solder points 703 are solder balls or bumps. Solder points may be dispensed on package substrate 102 by established methods known in the industry. Solder points 703 are to be reflowed subsequently.

Figure 7C:
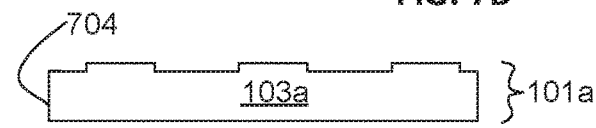
Figure 7C:
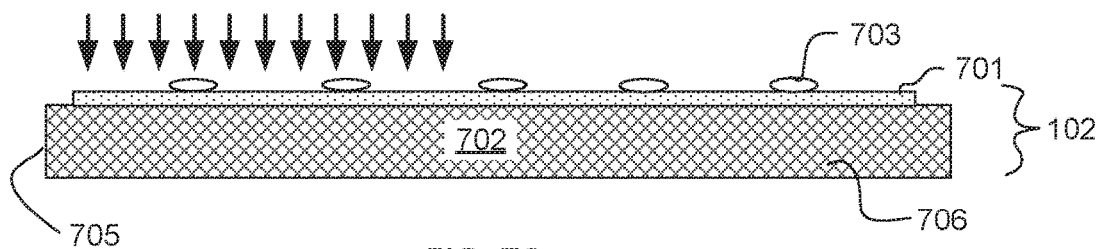

In the operation depicted in FIG. 7C, RF shield frame 100 assembly begins with placement of frame segment 103a on substrate 102. In the illustrated embodiment, frame segment 103a is the first of four frame segments (e.g., frame segments 103a-d in FIG. 1A) to be placed on substrate 102 for the assembly of RF shield frame 100 (see FIGS. 1A and 1B for structural details). However, the assembly process of RF shield frame 100 described herein is not limited to any particular order of part placement. Frame segments 103a-d may be assembled together in random order.

Any suitable method may be employed to place frame segment 103a (and the subsequent frame segments) on substrate 102. In some embodiments, an automated pick-and-place tool is employed to pick up frame segment parts and align them over substrate 102. Referring to FIG. 1A, some embodiments of RF shield frame 100 comprise pads 105, which provide a contact surface for a pick-and-place suction interface.

Returning to FIG. 7C, frame segment 103a is first aligned over substrate 102. In some embodiments, corner 704 of frame segment 103a is aligned with corner 705 of substrate 102. Frame segment 103a is also aligned with edge 706 of substrate 102. Down-pointing arrows indicate lowering of frame segment 103a to touch down on solder points 703.

Figure 7D:
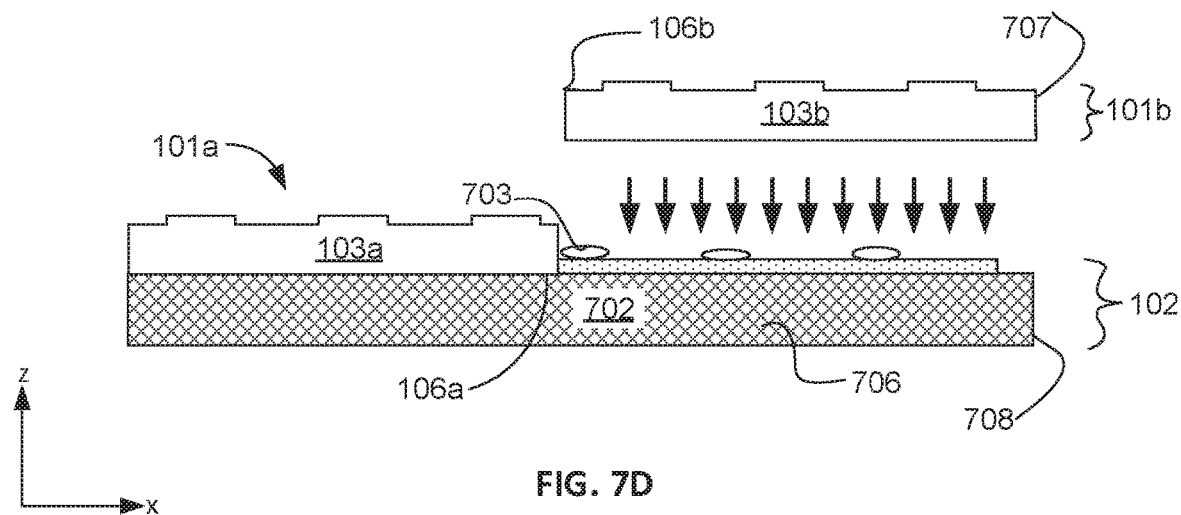

In the operation depicted in FIG. 7D, frame segment 103b is aligned and placed over substrate 102 subsequent to frame segment 103a. As mentioned above, the order of frame segment placement is not limited to any particular order or that depicted in the operation sequence shown in FIGS. 7C and 7D. In a manner similar to the operation of FIG. 7C, frame segment 103b is first aligned over substrate 102. In some embodiments, corner 707 of frame segment 103b is aligned with corner 708 and edge 706 of substrate 102. Additionally, frame segment 103b is aligned in such a way that interlocking segments 106a and 106b are aligned.

Interlocking segments 106a and 106b comprise interdigitating protrusions 108a and 108b (e.g., FIG. 1A). Referring back to FIG. 7D, the alignment operation of frame segments 103a and 103b is performed so that protrusions 108a and 108b (not shown) are interdigitated when frame segment 103b is lowered (indicated by down-pointing arrows) onto solder points 703. The operation creates an interlocking interface between frame segments 103a and 103b.

Remaining frame segments 103c and 103d may be added in any order to the assembly of RF shield frame 100 in two subsequent operations, similar to the operation depicted in FIG. 7D for frame segment 103b. As an example, frame segment 103c (not shown) is aligned with a third corner and edge of substrate 102, below the plane of the figure. The interlocking sections of both frame segment 103c and that of frame segment 103b (interlocking section 106b) are aligned. Frame segment 103c is then placed over substrate 102 to form an interlocking interface with frame segment 103b. Frame segment 103d is aligned with a fourth corner and edge of substrate 102, as well as alignment of the interlocking sections of frame segments 103c and 103a. Frame segment 103d forms an interlocking interface with both frame segment 103c and 103a as frame segment is placed over substrate 102.

Figure 7E:
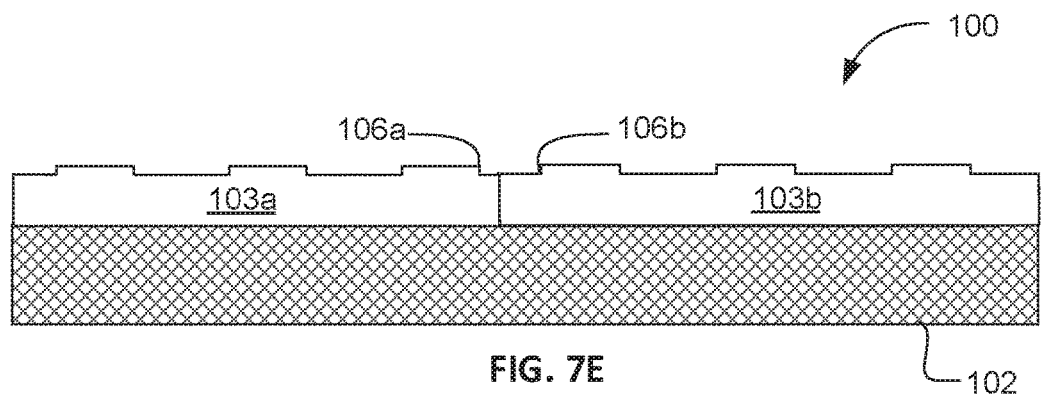

In the operation depicted in FIG. 7E, RF shield fame 100 is assembled. FIG. 1A shows the finished assembly in the x-y plane. A reflow operation is performed to solder frame segments to substrate 102 causing reflow of solder points 703, hidden from the view of the figure under frame segments 103a and 103b. The reflow operation may be performed in a reflow oven or in a thermal compression bonder.

Figure 7F:
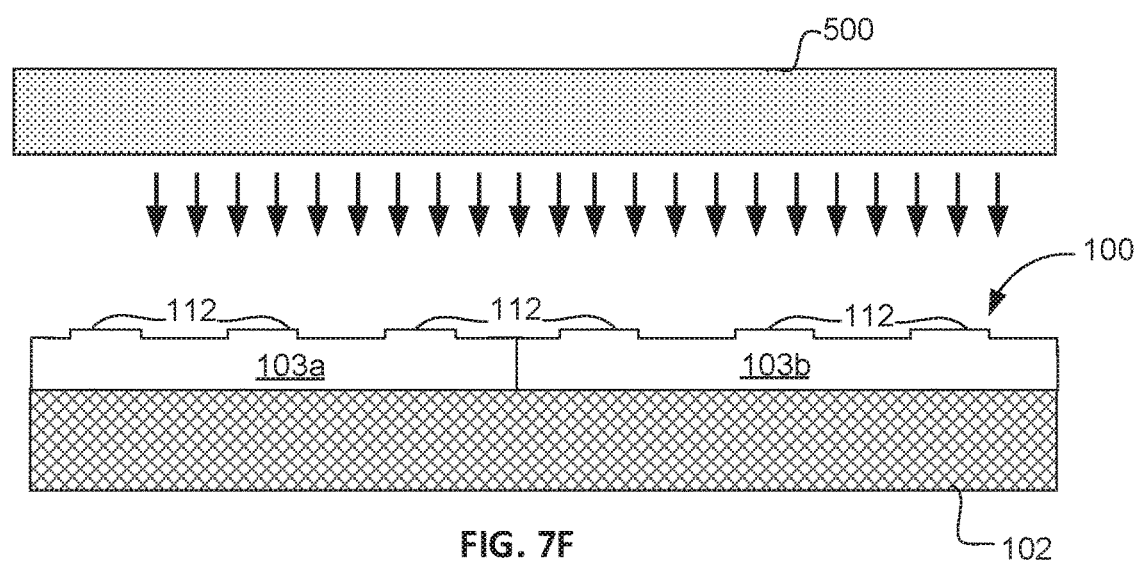

In the operation depicted in FIG. 7F, RF shield lid 500 (see FIGS. 5A and 5B) is aligned and placed over RF shield frame 100. In some embodiments, shield lid 500 comprises slots on the top (in the x-y plane, FIG. 5A) that align with embossments 112. In some embodiments, RF shield lid 500 is press fit to RF shield frame 100 (see discussion for FIG. 5B).

Figure 7G:
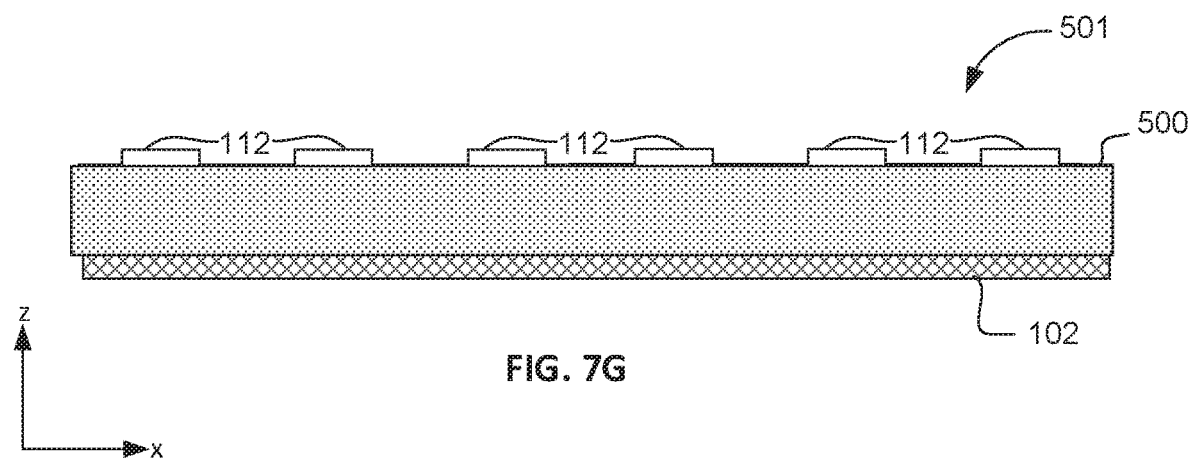

In FIG. 7G, assembly of RF shield 501 is completed. RF shield lid 500 is attached to RF shield frame 100 (FIG. 5C).

Figure 8:
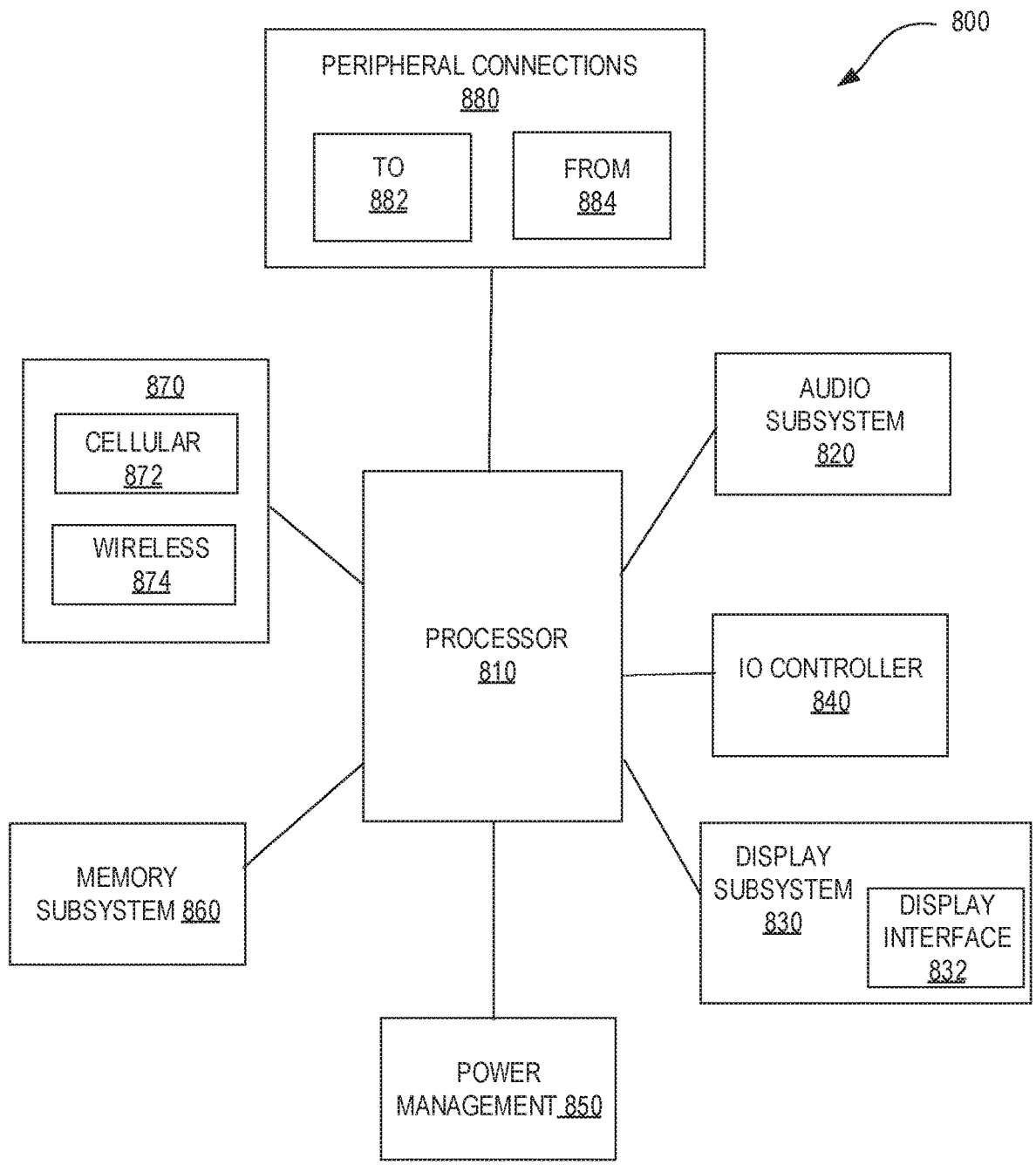
FIG. 8 illustrates an IC package having a warpage-compensating RF shield frame, fabricated according to the disclosed method, as part of a system-on-chip (SoC) package in an implementation of computing device, according to some embodiments of the disclosure.

FIG. 8 illustrates an IC package having a warpage-compensating RF shield (e.g., 500 in FIG. 5A-5C), fabricated according to the disclosed method, as part of a system-on-chip (SoC) package in an implementation of computing device, according to some embodiments of the disclosure.

FIG. 8 illustrates a block diagram of an embodiment of a mobile device in which flat surface interface connectors could be used. In some embodiments, computing device 800 represents a mobile computing device, such as a computing tablet, a mobile phone or smart-phone, a wireless-enabled e-reader, or other wireless mobile device. It will be understood that certain components are shown generally, and not all components of such a device are shown in computing device 800.

In some embodiments, computing device 800 includes a first processor 810. The various embodiments of the present disclosure may also comprise a network interface within 870 such as a wireless interface so that a system embodiment may be incorporated into a wireless device, for example, cell phone or personal digital assistant.

In one embodiment, processor 810 can include one or more physical devices, such as microprocessors, application processors, microcontrollers, programmable logic devices, or other processing means. The processing operations performed by processor 810 include the execution of an operating platform or operating system on which applications and/or device functions are executed. The processing operations include operations related to I/O (input/output) with a human user or with other devices, operations related to power management, and/or operations related to connecting the computing device 800 to another device. The processing operations may also include operations related to audio I/O and/or display I/O.

In one embodiment, computing device 800 includes audio subsystem 820, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 800, or connected to the computing device 800. In one embodiment, a user interacts with the computing device 800 by providing audio commands that are received and processed by processor 810.

Display subsystem 830 represents hardware (e.g., display devices) and software (e.g., drivers) components that provide a visual and/or tactile display for a user to interact with the computing device 800. Display subsystem 830 includes display interface 832 which includes the particular screen or hardware device used to provide a display to a user. In one embodiment, display interface 832 includes logic separate from processor 810 to perform at least some processing related to the display. In one embodiment, display subsystem 830 includes a touch screen (or touch pad) device that provides both output and input to a user.

I/O controller 840 represents hardware devices and software components related to interaction with a user. I/O controller 840 is operable to manage hardware that is part of audio subsystem 820 and/or display subsystem 830. Additionally, I/O controller 840 illustrates a connection point for additional devices that connect to computing device 800 through which a user might interact with the system. For example, devices that can be attached to the computing device 800 might include microphone devices, speaker or stereo systems, video systems or other display devices, keyboard or keypad devices, or other I/O devices for use with specific applications such as card readers or other devices.

As mentioned above, I/O controller 840 can interact with audio subsystem 820 and/or display subsystem 830. For example, input through a microphone or other audio device can provide input or commands for one or more applications or functions of the computing device 800. Additionally, audio output can be provided instead of, or in addition to display output. In another example, if display subsystem 830 includes a touch screen, the display device also acts as an input device, which can be at least partially managed by I/O controller 840. There can also be additional buttons or switches on the computing device 800 to provide I/O functions managed by I/O controller 840.

In one embodiment, I/O controller 840 manages devices such as accelerometers, cameras, light sensors or other environmental sensors, or other hardware that can be included in the computing device 800. The input can be part of direct user interaction, as well as providing environmental input to the system to influence its operations (such as filtering for noise, adjusting displays for brightness detection, applying a flash for a camera, or other features).

In one embodiment, computing device 800 includes power management 850 that manages battery power usage, charging of the battery, and features related to power saving operation. Memory subsystem 860 includes memory devices for storing information in computing device 800. Memory can include nonvolatile (state does not change if power to the memory device is interrupted) and/or volatile (state is indeterminate if power to the memory device is interrupted) memory devices. Memory subsystem 860 can store application data, user data, music, photos, documents, or other data, as well as system data (whether long-term or temporary) related to the execution of the applications and functions of the computing device 800.

Elements of embodiments are also provided as a machine-readable medium (e.g., memory 860) for storing the computer-executable instructions. The machine-readable medium (e.g., memory 860) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity via network interface 870 includes hardware devices (e.g., wireless and/or wired connectors and communication hardware) and software components (e.g., drivers, protocol stacks) to enable the computing device 800 to communicate with external devices. The computing device 800 could be separate devices, such as other computing devices, wireless access points or base stations, as well as peripherals such as headsets, printers, or other devices.

Network interface 870 can include multiple different types of connectivity. To generalize, the computing device 800 is illustrated with cellular connectivity 872 and wireless connectivity 874. Cellular connectivity 872 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 874 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 880 include hardware interfaces and connectors, as well as software components (e.g., drivers, protocol stacks) to make peripheral connections. It will be understood that the computing device 800 could both be a peripheral device ("to" 882) to other computing devices, as well as have peripheral devices ("from" 884) connected to it. The computing device 800 commonly has a "docking" connector to connect to other computing devices for purposes such as managing (e.g., downloading and/or uploading, changing, synchronizing) content on computing device 800. Additionally, a docking connector can allow computing device 800 to connect to certain peripherals that allow the computing device 800 to control content output, for example, to audiovisual or other systems.

In addition to a proprietary docking connector or other proprietary connection hardware, the computing device 800 can make peripheral connections 880 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

I claim:

1. An integrated circuit package shield comprising:
    a frame comprising two or more segments, the segments to interlock with one another along a substrate and the segments comprising electrically conductive material to electrically couple to the substrate; and
    a lid to cover the frame, the lid comprising a conductive material to electrically couple to the substrate.

2. The integrated circuit package shield of claim 1, wherein a first segment comprises a first interlocking section to interface with a second segment and a second interlocking section to interface with a third segment, wherein the first interlocking section is to restrict movement of the first segment in a first direction and the second interlocking section is to restrict movement of the first segment in a second direction that is unaligned with the first direction.

3. The integrated circuit package shield of claim 2, wherein the first direction and the second direction are substantially orthogonal.

4. The integrated circuit package shield of claim 2, wherein the second segment comprises a third interlocking section to interface with the first interlocking section, and the third segment comprises a fourth interlocking section to interface with the second interlocking section.

5. The integrated circuit package shield of claim 4, wherein the first interlocking section comprises one or more protrusions to interdigitate with one or more protrusions of the third interlocking section and the second interlocking section comprises one or more protrusions to interdigitate with one or more protrusions of the fourth interlocking section.

6. The integrated circuit package shield of claim 5, wherein the interdigitated one or more protrusions of the first interlocking section and the one or more protrusions of the third interlocking section have a meandering boundary, the meandering boundary to extend from an edge of the substrate to a first distance the frame extends over the substrate, wherein the first distance is substantially orthogonal to the first direction.

7. The integrated circuit package shield of claim 6, wherein the interdigitated one or more protrusions of the second interlocking section and one or more protrusions of the fourth interlocking section have a second meandering boundary, the second meandering boundary to extend from the edge of the substrate to a second distance the frame extends over the substrate, wherein the second distance is substantially orthogonal to the second direction.

8. The integrated circuit package shield of claim 1, wherein the one or more protrusions have a rounded profile or a pointed profile.

9. The integrated circuit package shield of claim 1, wherein the frame further comprises a fourth segment, wherein the fourth segment comprises a fifth interlocking section to interface with the second segment, and a sixth interlocking section to interface with the third segment, and wherein the fifth interlocking section is to restrict movement of the fourth segment in a first direction and the sixth interlocking section is to restrict movement of the fourth segment in a second direction that is unaligned with the first direction.

10. The integrated circuit package shield of claim 1, wherein the two or more segments comprise two or more elongate members that extend over the substrate, and wherein the two or more elongate members intersect.

11. The integrated circuit package shield of claim 1, wherein the frame comprises any of copper, nickel or beryllium.

12. A system comprising:
an integrated circuit die on a substrate;
a shield surrounding the integrated circuit die, the shield comprising:
a frame laterally surrounding the integrated circuit die, the frame comprising two or more interlocking segments, the interlocking segments comprising electrically conductive material electrically coupled to the substrate; and
a lid over the integrated circuit die and the frame, the lid comprising a conductive material electrically coupled to the substrate.

13. The system of claim 12, wherein the substrate comprises a ground plane, and wherein the segments are electrically coupled to the ground plane.

14. The system of claim 13, wherein the segments are electrically coupled to the ground plane by solder joints.

15. The system of claim 12, wherein the frame comprises one or more embossments along at least one edge of the frame, wherein the lid comprises at least one edge and one or more perforations proximal to the at least one edge, and wherein the one or more perforations are to align with the one or more embossments, such that the movement of the lid relative to the frame is restricted in two orthogonal directions.

16. The system of claim 12, wherein the lid is solder-bonded to the frame.

17. The system of claim 12, wherein the lid comprises any of copper, nickel or beryllium.

18. A method comprising:
forming an integrated circuit package substrate;
placing a first shield frame segment over the substrate, wherein the first shield frame segment comprises a first interlocking section and a second interlocking section, wherein the first interlocking comprises one or more protrusions, and the second interlocking section comprises one or more protrusions, and wherein the first interlocking section is to restrict movement of the first shield frame segment in a first direction and the second interlocking section is to restrict movement of the first shield frame segment in a second direction that is unaligned with the first direction;
placing a second shield frame segment over the substrate, wherein the second shield frame segment comprises a third interlocking section, wherein the third interlocking section comprises protrusions, and wherein the third interlocking section is interfaced with the first interlocking section of the first shield frame segment;
placing a third shield frame segment over the substrate, wherein the third shield frame segment comprises a fourth interlocking section, wherein the fourth interlocking section comprises protrusions, and wherein the fourth interlocking section is interfaced with the second interlocking section of the first shield frame segment; and
placing a fourth shield frame segment over the substrate, wherein the fourth shield frame segment is interfaced with the second shield frame segment and the third shield frame segment.

19. The method of claim 18, wherein placing a second shield frame segment over the substrate, wherein the second shield frame segment comprises a third interlocking section, and wherein the third interlocking section is interfaced with the first interlocking section of the first shield frame segment comprises interdigitating the one or more protrusions of the first interlocking section with the one or more protrusions of the third interlocking section.

20. The method of claim 18, further comprising:
placing solder on the substrate; and
reflowing the solder to bond the first, second third and fourth shield frame segments to the substrate.

* * * * *